United States Patent
Wada et al.

(10) Patent No.: US 6,666,943 B2
(45) Date of Patent: Dec. 23, 2003

(54) FILM TRANSFER METHOD

(75) Inventors: Takatsugu Wada, Kanagawa (JP); Hidetoshi Nojiri, Kanagawa (JP); Masatake Akaike, Kanagawa (JP); Takehiko Kawasaki, Kanagawa (JP); Rei Kurashima, Kanagawa (JP); Satoshi Nozu, Kanagawa (JP); Kozo Hokayama, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 25 days.

(21) Appl. No.: 09/998,227

(22) Filed: Dec. 3, 2001

(65) Prior Publication Data

US 2002/0066525 A1 Jun. 6, 2002

(30) Foreign Application Priority Data

Dec. 4, 2000 (JP) ........................ 2000-368702
Nov. 19, 2001 (JP) ........................ 2001-352908

(51) Int. Cl.[7] .................. B44C 1/165; B32B 31/14; B32B 3/00; H01L 21/00; H01L 21/30
(52) U.S. Cl. .................. 156/230; 156/233; 156/236; 156/247; 156/289; 427/149; 428/195; 428/202; 428/209; 428/914; 438/21; 438/689; 438/745; 117/915
(58) Field of Search ................. 156/230, 233, 156/236, 239, 247, 289; 427/146, 147, 148, 149; 428/914, 195, 202, 208, 209; 438/21, 745, 974, 689; 117/915, 952

(56) References Cited

U.S. PATENT DOCUMENTS 4,364,021 A * 12/1982 Levinson .................. 338/20
5,574,279 A * 11/1996 Ikeda et al. ............... 250/306
5,846,844 A * 12/1998 Akasaki et al. ............. 437/21

FOREIGN PATENT DOCUMENTS

| EP | 930165 A1 * | 7/1999 | ........... B41J/2/045 |
| JP | 58-153223 * | 9/1983 | ........... G11B/5/42 |
| JP | 6-290983 | 10/1994 | |
| JP | 10-286953 | 10/1998 | |
| JP | 11-220185 | 8/1999 | |

* cited by examiner

Primary Examiner—J. A. Lorengo
(74) Attorney, Agent, or Firm—Fitzpatrick, Cella, Harper & Scinto

(57) ABSTRACT

A device is formed by transferring a film onto a substrate when the film requires but the substrate is not adapted to a high temperature heat treatment process. The film having layers and formed on a first substrate having layers is transferred onto a second substrate having layers. The method of transferring the film comprises a first step of forming a lift-off layer and the film to be transferred on the first substrate, a second step of bonding the film to be transferred to the second substrate and a third step of separating the film to be transferred from the first substrate by etching the lift-off layer and transferring it onto the second substrate.

16 Claims, 9 Drawing Sheets

FILM TRANSFER METHOD

BACKGROUND OF THE INVENTION

1. Field of the Invention

This invention relates to a film transfer method. More particularly, it relates to a method of transferring a film having functional features such as producing a piezoelectric effect and adapted to be suitably used for an actuator, a sensor, a liquid droplets ejector or some other applications.

2. Related Background Art

Currently, massive research efforts are being paid for developing devices using functional films. It is expected to realize marvelous functional features by forming thin films of such functional materials and applying them to various devices.

For example, various researches are being made on devices such as piezoelectric elements, sensors and non-volatile memories that can be realized by utilizing various physical properties of ferromagnetic substances including a piezoelectric effect, a pyroelectric effect and a polarization inversion effect. Particularly, ink-jet systems adapted to eject ink by using piezoelectric elements have been developed rapidly for various applications including printers, copying machines and facsimile machines in recent years because they can record high definition and high quality images including color images at high speed and high density if they come out with small dimensions. It should be noted, however, that there is a strong demand for technologies that can realize higher quality and higher definition images and piezoelectric elements comprising a film that shows a piezoelectric effect are currently regarded to be highly promising for the next generation high quality and high definition recording technologies.

While various method may be used for forming a film showing a piezoelectric effect, Japanese Patent Application Laid-open No. 6-290983 describes a method of forming PZT (Pb(Zr$_x$,Ti$_{1-x}$)O$_3$; lead zirconate titanate) with improved crystallinity by using RF sputtering. Japanese Patent Application Laid-open No. 11-220185 describes a method of forming PZT oriented to the (100) plane by using the sol-gel method and controlling the temperature for decomposing the precursor substance.

Many oxides can be used for making functional thin films. Particularly, since a film showing a piezoelectric effect is normally made of a compound oxide, temperature higher than 600° C. will be required for crystallizing such a substance. For crystallization, a film may be formed in a non-heating film forming process at temperature between room temperature and about 200° C. and subsequently annealed at temperature higher than 600° C. Alternatively, a crystallized film may be formed by heating a substrate to temperature above 600° C. for the purpose of simultaneous crystallization. In any case, a single-crystal substrate that can withstand high temperature needs to be used for forming a film showing a piezoelectric effect because temperature higher than 600° C. is involved in the crystallization process. While the single-crystal substrate may be made of MgO or SrTiO$_3$, such a substrate is normally very costly and hence it is disadvantageous from the viewpoint of cost if it is consumed in a single film forming process.

Additionally, after forming a film showing a piezoelectric effect on a single-crystal substrate, the substrate is bonded to another substrate and dissolved typically by means of hot phosphoric acid. For instance, Japanese Patent Application Laid-open No. 10-286953 describes a method of removing a MgO substrate by means of phosphoric acid after forming PZT on the substrate and bonding the substrate to a vibrating plate. However, such a process is very disadvantageous from the viewpoint of cost and throughput and hence not feasible for mass production.

These problems and other problems can advantageously be avoided when the film formed on a substrate is transferred onto some other substrates because the first substrate is not damaged.

The present invention makes it possible to transfer a film onto a substrate that is not adapted to directly form a film thereon without damaging the costly single-crystal substrate on which the film is originally formed by using an easy means having a simple configuration and utilizing a lift-off layer.

SUMMARY OF THE INVENTION

According to the invention, there is provided a film transfer method for transferring a film from a first substrate onto a second substrate, said method comprising steps of:

forming a lift-off layer on said first substrate;

forming a film to be transferred on said lift-off layer;

bonding said film to be transferred onto said second substrate; and etching said lift-off layer by means of an etchant and separating said second substrate from said first substrate.

DESCRIPTION OF THE PREFERRED EMBODIMENTS

Figure 1:
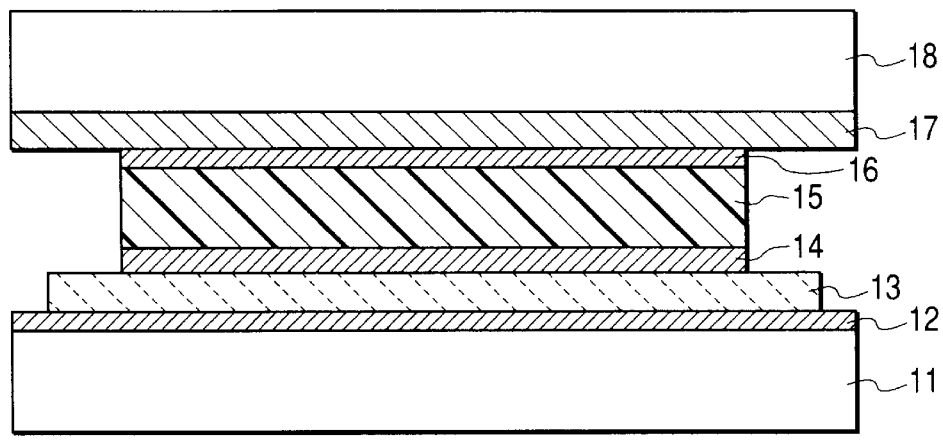
FIG. 1 is a schematic cross sectional view of a film showing a piezoelectric effect when a ZnO layer is formed, said film being applied to the examples as described hereinafter.

Now, the present invention will be described in greater detail by referring to the accompanying drawings.

The inventors of the present invention have found a method of transferring a thin film, utilizing a difference of etching rate. It is now possible to transfer a functional film onto a substrate that cannot be used to directly form the film thereon by forming a lift-off layer that is easily soluble to dilute strong acid or weak acid on a costly single-crystal substrate, forming thereon a functional film that is hardly soluble to dilute strong acid or acetic acid and separating the single-crystal substrate by etching the lift-off layer, utilizing the difference of etching rate. Thus, according to the invention, it is now possible to realize various functional devices.

Therefore, it is now possible to reduce the cost of manufacturing a functional thin film by repeatedly reusing a single-crystal substrate that hitherto has to be thrown away after a single use. Additionally, it is now possible to remarkably improve the throughput by eliminating the time consuming step of dissolving the single-crystal substrate.

According to the invention, it is possible to transfer a film having various functional features including a piezoelectric effect and a magnetic effect to produce various functional devices. Uni-morph type actuators and ink-jet heads comprising such a uni-morph type actuator were prepared by transferring a functional film having a piezoelectric effect in the examples and the comparative examples that will be described hereinafter.

For the purpose of the present invention, any dilute strong acid with a concentration not greater than 10 mol % or any weak acid with an electrolytic dissociation constant not greater than $10^{-3}$ may be used. However, the use of hydrochloric acid, nitric acid, sulfuric acid or a mixture thereof is preferable for dilute strong acid and the use of acetic acid is preferable for weak acid. While dilute strong acid refers to strong acid with a concentration not greater than 10 mol % for the purpose of the present invention, the concentration is preferably lowered to not greater than 1 mol % in order to minimize the adverse effect of the acid on the film to be transferred. Beside acetic acid, boric acid and silicic acid may be listed as weak acids that can be used for the purpose of the invention.

While various candidate materials may be listed for the lift-off layer for the purpose of the invention, it is preferable to use ZnO that is easily soluble to dilute strong acid and weak acid and can withstand a high temperature process for the lift-off layer. ZnO is an oxide that is easily soluble to acid which may be dilute strong acid with a concentration not greater than 10 mol % or weak acid with an electrolytic dissociation constant not greater than $10^{-3}$. Any appropriate film forming process may be used for preparing ZnO that operates as lift-off layer. Methods that can be used for preparing ZnO include RF sputtering, ion beam sputtering, ion plating, EB evaporation, plasma CVD, MO-CVD and laser abrasion. An ordinary plating method may also be used. A thin ZnO film that satisfactorily operates as lift-off layer for the purpose of the invention can be prepared by any of the above listed methods.

While the thin film operating as lift-off layer for the purpose of the invention may have any film thickness, the film thickness is preferably not less than 1.0 μm because a lift-off layer having such a film thickness can be etched along the sides thereof at an accelerated rate in order to easily separate the functional film. More preferably, the film thickness of the lift-off layer is not less than 10 μm from a practical process point of view. As a basic requirement, the profile and the area of the thin film operating as lift-off layer need to be same as those of the film to be transferred. However, preferably, the profile and the area of the thin film are such that they make the thin film more than completely cover the film to be transferred in order to make the etching process start early and progress at an accelerated rate. Particularly, it is preferable that the edges of the lift-off layer are found outside the edges of the film to be transferred.

Preferably, the ZnO lift-off layer is uniaxially oriented and grains are made to grown in a single direction so that the etchant may easily move between grain boundaries.

For the purpose of the invention, the material of the film to be transferred may be selected from a number of candidate materials. However, it is preferable to use a compound oxide material that is particularly hardly soluble to dilute strong acid and weak acid if compared with the lift-off layer. It is more preferable to use a compound oxide material showing a piezoelectric effect. For the purpose of the invention, the expression of being preferably hardly soluble if compared with the lift-off layer refers to an etching rate less than a 1,000th of that of the lift-off layer. Any appropriate film forming method may be used for forming a film showing a piezoelectric effect. Examples of film forming methods that can be used for the purpose of the invention include RF sputtering, ion beam sputtering, ion plating, EB evaporation, plasma CVD, MO-CVD and laser abrasion. While any of these methods can be used to form a thin oxide film, RF sputtering is preferable because it can allow the substrate temperature to vary and the composition of the source gas to be controlled by controlling the gas pressure particularly in the case of forming a thin film showing a piezoelectric effect where the composition of the source gas significantly affect the piezoelectric performance of the thin film.

While the film showing a piezoelectric effect may be selected from a large number of films showing a piezoelectric effect that are available, a perovskite oxide material containing Pb is particularly preferable for the purpose of the invention. Typical examples of perovskite oxide materials containing Pb include $Pb(Zr,Ti)O_3$ and $(Pb,La)(Zr,Ti)O_3$. Particularly, the use of $Pb(Zr,Ti)O_3$ (to be referred to as PZT) is preferable because its piezoelectric effect is remarkable. Other perovskite oxide materials showing a remarkable piezoelectric effect include $Pb(Zn,Nb)O_3$—$PbTiO_3$ solid solution (to be referred to as PZN-PT) and $Pb(Mg,Nb)O_3$—

PbTiO$_3$ solid solution (to be referred to as PMN-PT) as these substances show a piezoelectric effect much more remarkable than PZT.

Figure 2:
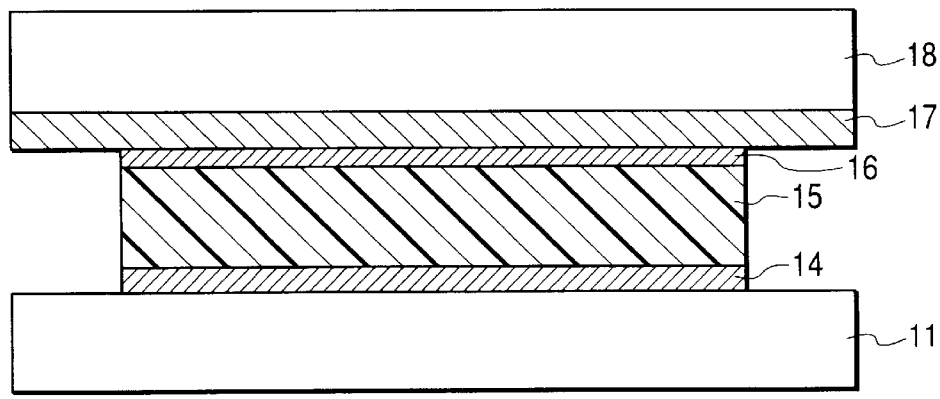
FIG. 2 is schematic cross sectional view of a film showing a piezoelectric effect when a ZnO layer is not formed, said film being applied to the comparative examples as described hereinafter.

Now, the structure of a piezoelectric element that can suitably be used for a method of transferring a film showing a piezoelectric effect according to the invention will be briefly discussed by referring to FIGS. 1 and 2. FIG. 1 is a schematic cross sectional view of a piezoelectric element that can most suitably be used for the purpose of the invention. Referring to FIG. 1, a noble metal film 12 that is hardly soluble to acid is formed on a sufficiently thick substrate 11 in order to prevent diffusion of atoms and then a ZnO film 13 is formed thereon as lift-off layer that is easily soluble to weak acid. Then, a first electrode film 14 is formed thereon by using noble metal in order to prevent diffusion of atoms and operate as electrode and a film to be transferred 15 showing a piezoelectric effect is formed thereon. Although not shown, a film of nitride such as SiN may be formed either between the lift-off layer 13 and the first electrode film 14 or between the first electrode film 14 and the film to be transferred 15 in order to effectively prevent diffusion of atoms. Then, a second electrode 16 is formed on the film to be transferred 15 and a substrate 18 carrying a thin vibrating plate 17 having a thickness less than 10 μm and bonded to the substrate 18 is bonded onto the second electrode 16. Subsequently, the ZnO film 13 is dissolved into weak acid showing an electrolytic dissociation constant less than 10$^{-3}$ such as acetic acid to separate the substrate 11 on which the noble metal film 12 is formed. In this way, the film to be transferred including the first electrode film 14, the film showing a piezoelectric effect 15 and the second electrode 16 is transferred to the substrate 18 carrying a thin vibrating plate 17 bonded thereto. The separated substrate 11 carrying the noble metal film 12 formed thereon can be reused by forming a ZnO film 13, a first electrode film 14, a film showing a piezoelectric effect 15 and a second electrode 16 for another time. Thus, the cost of the substrate 11 for manufacturing a film showing a piezoelectric effect can be reduced by reusing the substrate 11 carrying the noble metal film 12 formed thereon repeatedly.

FIG. 2 schematically illustrates the structure of a popular piezoelectric element comprising a film showing a piezoelectric effect that was used in the comparative examples. As shown in FIG. 2, a first electrode 14 is formed on a substrate 11 and a film showing a piezoelectric effect 15 is formed thereon but no lift-off layer that is soluble to weak acid is formed. Then, a second electrode 16 is formed thereon and a substrate 18 carrying a thin vibrating plate 17 having a thickness less than 10 μm and bonded to the substrate 18 is bonded onto the second electrode 16. Now, the present invention will be described further by way of examples and comparative examples.

EXAMPLES

Now, the present invention will be described in greater detail by referring to the accompanying drawings that illustrate examples and comparative examples.

In these examples, RF sputtering was employed for forming films and a ZnO layer was used for the lift-off layer, while a PZT film was used for the film showing a piezoelectric effect.

FIGS. 5 through 9 are schematic cross sectional views of a piezoelectric element being manufactured by using a film transfer method according to the invention in different manufacturing steps.

Example 1

Figure 3:
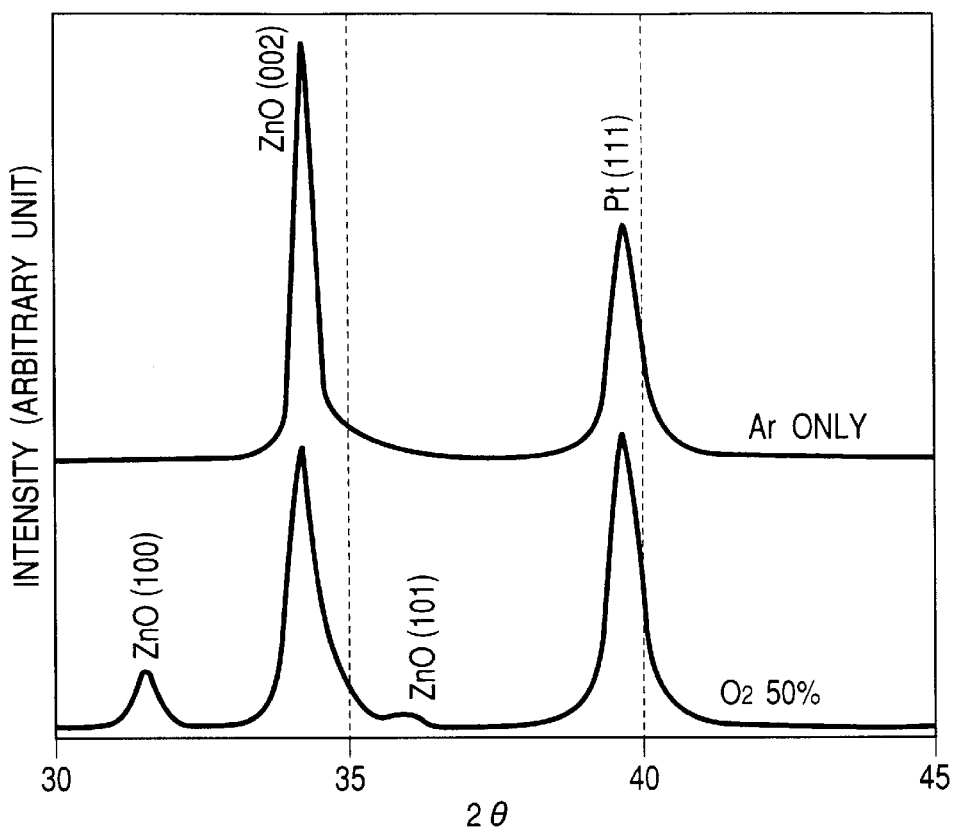
FIG. 3 is a graph showing the X-ray diffraction pattern of a ZnO layer as applied to the description of Example 1.
Figure 5:
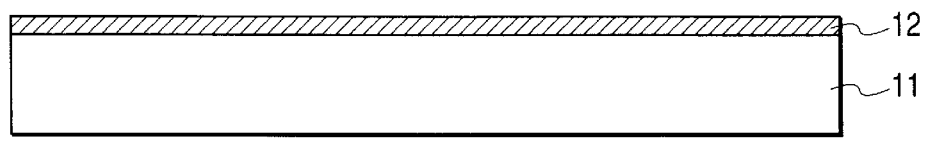
FIG. 5 is a schematic cross sectional view of a piezoelectric element being manufactured by using a film transfer method according to the invention, illustrating a manufacturing step thereof.
Figure 6:
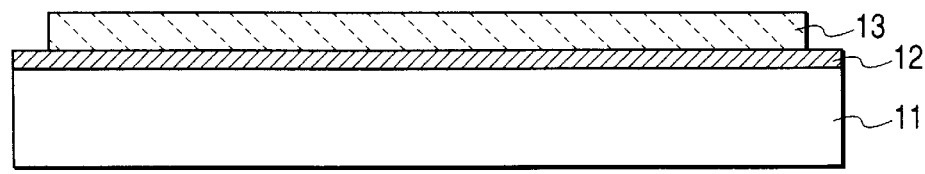
FIG. 6 is a schematic cross sectional view of a piezoelectric element being manufactured by using a film transfer method according to the invention, illustrating a manufacturing step subsequent to that of FIG. 5.

As shown in FIG. 5, a 20 nm thick tightly adhering layer of Ti and a 150 nm thick buffer layer 12 of Pt that resists corrosion in a washing process for reuse and prevents diffusion of atoms were formed on a MgO single-crystal substrate 11 by RF sputtering to prepare a Pt(111)/Ti/MgO substrate. Then, as shown in FIG. 6, a ZnO layer 13 was formed by RF sputtering. FIG. 3 is a graph showing the X-ray diffraction pattern of a ZnO layer formed on a Pt(1111)/Pyrex substrate at substrate temperature of 300° C. As clearly seen from FIG. 3, the grains of the ZnO film were completely oriented in the direction of the C-axis when the film was formed by using only Ar gas. Therefore, in this example, the ZnO film was formed to a thickness of 1 μm by using only Ar gas with indicated gas pressure of 2.0 Pa and at substrate temperature of 300° C.

Figure 4:
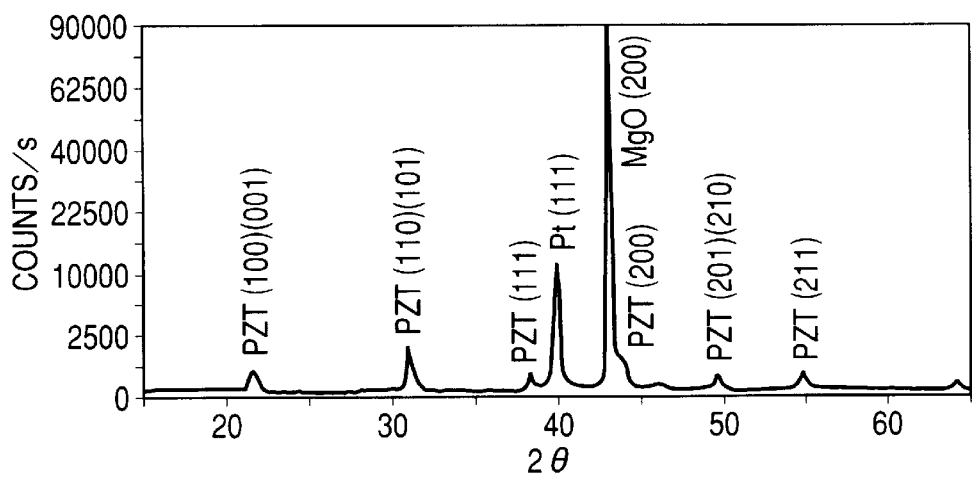
FIG. 4 is a graph showing the X-ray diffraction pattern of a lead zirconate titanate film as applied to the description of Example 1 and Comparative Example 1.
Figure 7:
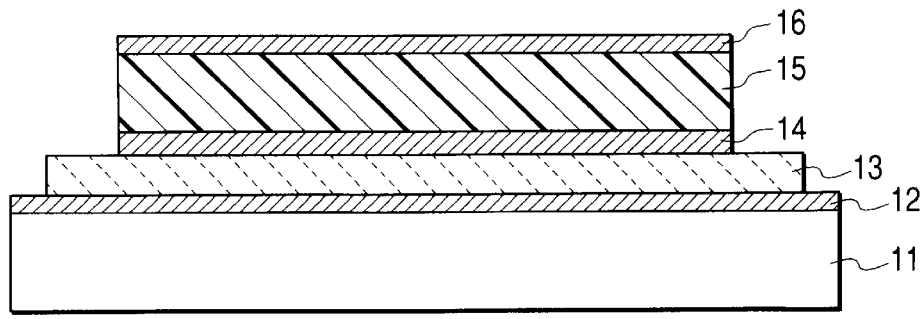
FIG. 7 is a schematic cross sectional view of a piezoelectric element being manufactured by using a film transfer method according to the invention, illustrating a manufacturing step subsequent to that of FIG. 6.

Then, as shown in FIG. 7, a Pt film is formed on the ZnO layer 13 to produce a first electrode 14 having an area smaller than the ZnO layer 13 by RF sputtering. Then, a lead zirconate titanate film was formed thereon with an area same as the first electrode 14. FIG. 4 is a graph showing the X-ray diffraction pattern of a lead zirconate titanate film after annealing at 700° C. for five hours formed on a Pt(111)/MgO substrate only under Ar gas pressure with the substrate heater held in a turned off state. The formed lead zirconate titanate film becomes a non-oriented lead zirconate titanate single layer as shown in FIG. 4 after a post heat treatment process. In this example, a 3 μm thick amorphous lead zirconate titanate layer 15 was formed on the surface with indicated Ar gas pressure of 3.0 Pa with the substrate heater held in a turned off state.

The produced lead zirconate titanate PZT film was crystallized in an oxygen atmosphere by raising the temperature at a rate of 1° C./min and annealing it at 700° C. for 5 hours. Then, a second electrode 16 of Pt was formed by RF sputtering on the surface of the lead zirconate titanate film on the PZT/Pt/ZnO/Pt/Ti/MgO substrate to produce a substrate structure of Pt/PZT/Pt/ZnO/Pt/Ti/MgO.

Figure 8:
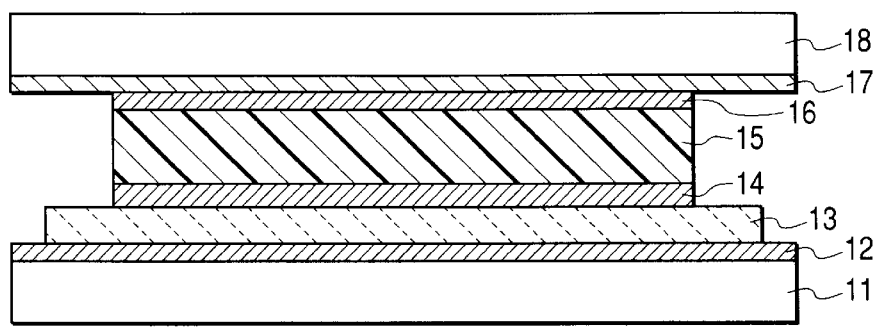
FIG. 8 is a schematic cross sectional view of a piezoelectric element being manufactured by using a film transfer method according to the invention, illustrating a manufacturing step subsequent to that of FIG. 7.

Thereafter, a specimen of actuator was prepared for the purpose of evaluation by bonding a 30 μm thick Pyrex glass as vibrating plate 17 onto an Si substrate 18 provided with grooves as will be described hereinafter by means of anodic bonding and then the Pyrex glass was made as thin as 5 μm by polishing. Subsequently, as shown in FIG. 8, the Si substrate 18 to which the vibrating plate 17 of Pyrex glass had been bonded was bonded to the side of the second electrode 16 of the MgO substrate by means of an epoxy type adhesive agent.

Figure 9:
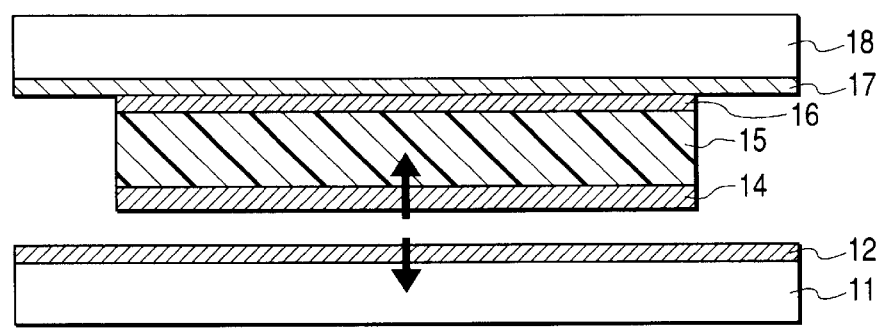
FIG. 9 is a schematic cross sectional view of a system using a film transfer method according to the invention, illustrating a step subsequent to that of FIG. 8.

Then, the substrates were heated to 150° C. to completely set the epoxy resin and then immersed in an acetic acid solution. The acetic acid solution was prepared by mixing glacial acetic acid and pure water at a ratio of 1:2. While the C-axis oriented ZnO film was etched at a very high rate in the acetic acid solution, the lead zirconate titanate film was hardly etched. Only the ZnO film was dissolved into the acetic acid solution and removed within a few minutes because ZnO is highly soluble to acetic acid solution when the solution was stirred by means of a stirrer and the etching process was conducted while applying ultrasonic oscillations in order to raise the efficiency of etching the ZnO film. Thus, as shown in FIG. 9, the separated film (including the first electrode film 14, the film showing a piezoelectric effect 15 and the second electrode 16) was perfectly transferred.

Since the lift-off layer of ZnO had a surface area greater than the lead zirconate titanate film that was the film to be transferred, the etchant at the initial stage could easily catch the lift-off layer to accelerate the etching process. It should be noted that the etching process proceeds slowly when both the lift-off layer of ZnO and the lead zirconate titanate film to be transferred have a same surface area because the etchant cannot catch the lift-off layer easily because of the selectivity ratio.

While the etching process may proceed without applying ultrasonic oscillations, the substrate generates oscillations to make the etchant easily get into the inside and accelerate the etching process when ultrasonic oscillations are applied. Therefore, ultrasonic oscillations are preferably applied for the purpose of the invention.

The technique of stirring the etchant by means of a stirrer and/or rotating the substrate in the etchant is popular for making the etchant to easily get into the inside of a layer to be etched. Therefore, such a technique is preferably used for a film transfer method according to the invention.

A uni-morph type actuator carrying a vibrating plate bonded to one of the surfaces of a piezoelectric element that was formed by arranging electrodes on the top and the bottom of a film showing a piezoelectric effect was prepared in this example. Various devices can be prepared by using such uni-morph type actuators and processing the Si substrates in various different ways. In this example, an ink-jet head comprising uni-morph type actuators was prepared by forming a groove on the Si substrate.

Figure 10:
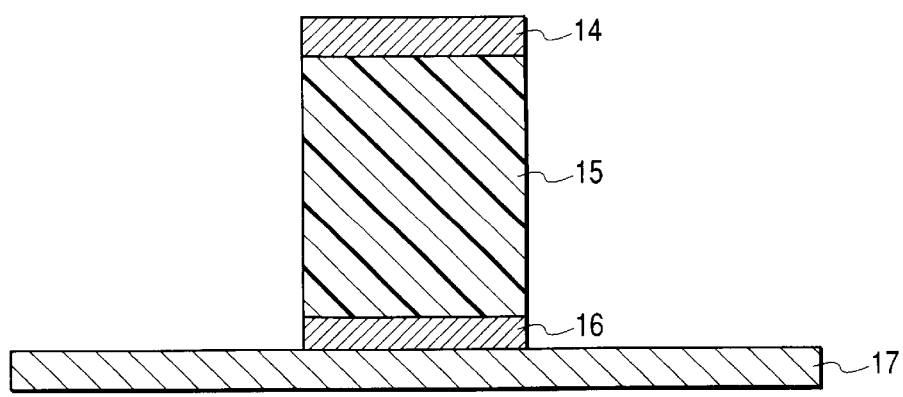
FIG. 10 is schematic cross sectional view of a uni-morph type actuator prepared for evaluating the examples as described hereinafter.
Figure 11:
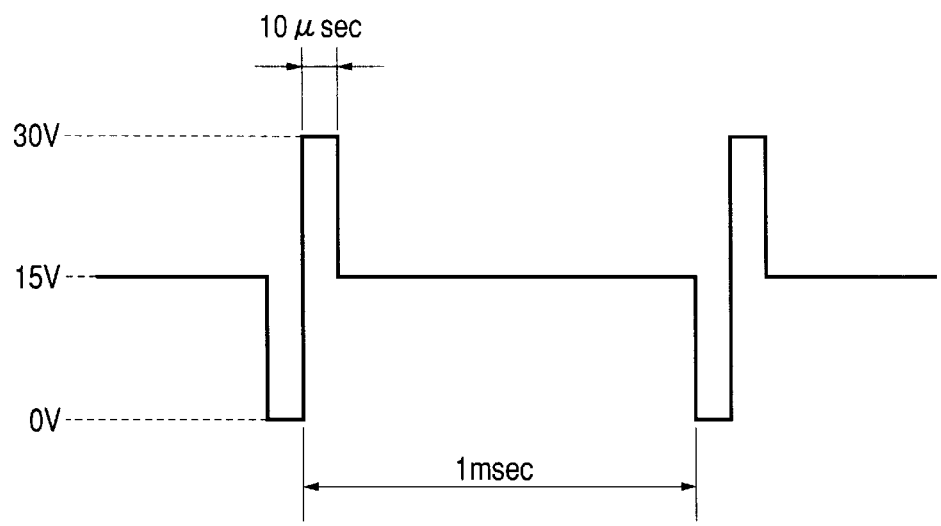
FIG. 11 is a graph illustrating the drive waveform that was used for evaluating the piezoelectric elements of the examples as described hereinafter.

An operation of producing a pattern in alignment with the grooves on the Si substrate was conducted on the Pt of the first electrode 14 on the separated lead zirconate titanate film by dry etching. Then, the lead zirconate titanate film was subjected to a wet etching operation along the Pt pattern. FIG. 10 is a schematic cross sectional view of the uni-morph actuator prepared in this manner. The prepared uni-morph actuator showed a satisfactory displacement when a rectangular wave as shown in FIG. 11 was applied to it and observed by way of a laser Doppler displacement meter.

It was possible to repeatedly reuse the separated Pt/Ti/MgO substrate to provide a great advantage from the cost point of view.

Figure 12:
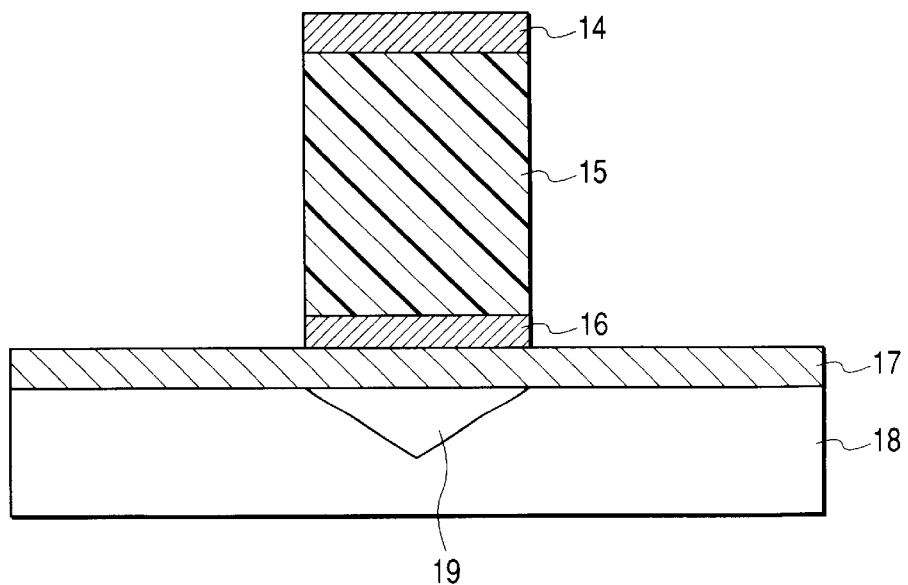
FIG. 12 is a schematic cross sectional view of an ink-jet head prepared by applying a uni-morph type piezoelectric element realized by using a film showing a piezoelectric effect as applied to the examples.
Figure 13:
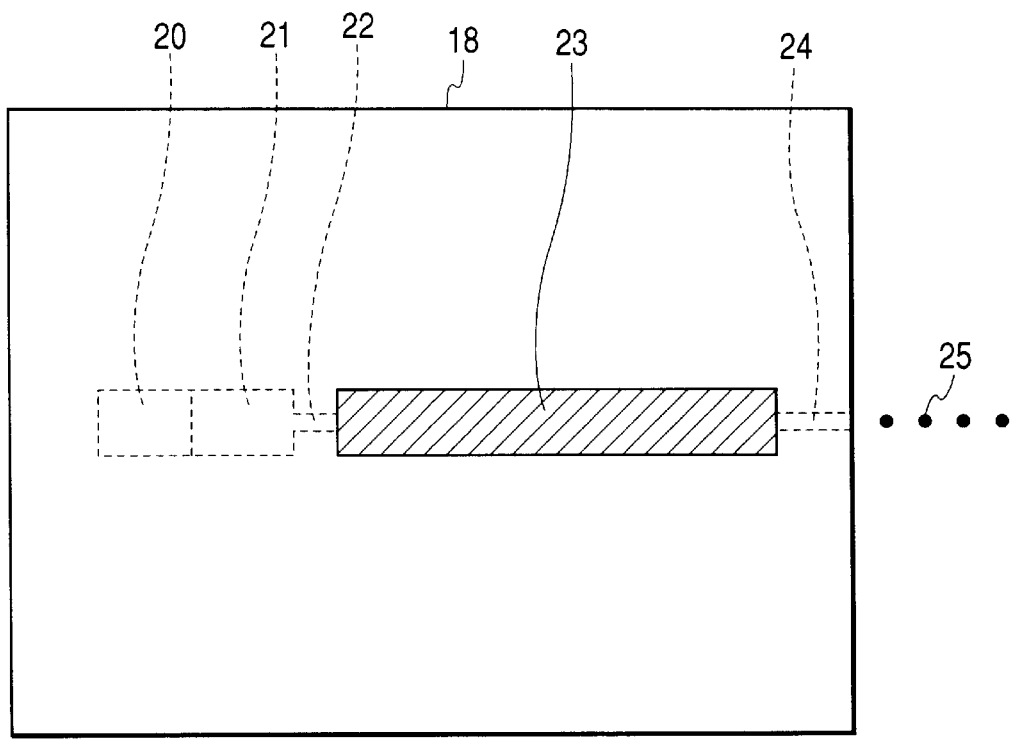
FIG. 13 is a schematic plan view of an ink-jet head prepared by applying a uni-morph type piezoelectric element realized by using a film showing a piezoelectric effect as applied to the examples.

The prepared ink-jet head for ejecting ink was tested for ink ejection. The groove had been formed on the Si(100) substrate as ink flow path by anisotropic etching. FIG. 12 is a schematic cross sectional view of the ink-jet head prepared in this example as viewed from the side of the nozzle, showing the triangular prism profile of the groove 12. FIG. 13 is a schematic plan view of the ink-jet head. It comprises an ink supply chamber through hole 20, an ink supply chamber 21, a communication nozzle 22, a pressure chamber, a uni-morph type piezoelectric element 23 arranged thereon and an ejection nozzle 24. A passage is formed through part of the ink supply chamber 21. Isopropyl alcohol (IPA) was filled into the ink-jet head and the ink-jet head was driven to operate by applying a drive waveform as shown in FIG. 11 to see that droplets 25 were ejected from the ejection nozzle 24.

Comparative Example 1

An ink-jet head was prepared by using an actuator same as that of Example 1 except that it had no liftoff layer of ZnO. More specifically, a Pt(111)/Ti/MgO substrate was formed by RF sputtering. Subsequently, a 3 μm thick lead zirconate titanate (PZT) film was formed thereon without a ZnO layer to produce a PZT/Pt/Ti/MgO substrate.

The temperature of the formed film was raised in an oxygen atmosphere at a rate of 1° C./min. and annealed at 700° C. for 5 hours. Then, a second electrode of Pt was formed by RF sputtering on the surface of the lead zirconate titanate film to produce a substrate structure of Pt/PZT/Pt/Ti/MgO.

Thereafter, as in Example 1, a specimen of actuator was prepared for the purpose of evaluation by bonding an Si substrate to the side of the second electrode of the MgO substrate by means of an epoxy type adhesive agent. Note that the Si substrate had been provided with a groove and a polished thin 5 μm vibrating plate of Pyrex glass had been bonded to the Si substrate by anodic bonding as in Example 1. The substrates were heated to 150° C. to completely set the epoxy resin and then the MgO substrate was removed by means of hot phosphoric acid. It took several hours for removing the MgO substrate to prove that the throughput of mass production of such actuators is unacceptable. Additionally, a costly MgO substrate has to be consumed for preparing each actuator to raise the cost of manufacturing actuators on a mass production basis.

Example 2

Figure 14:
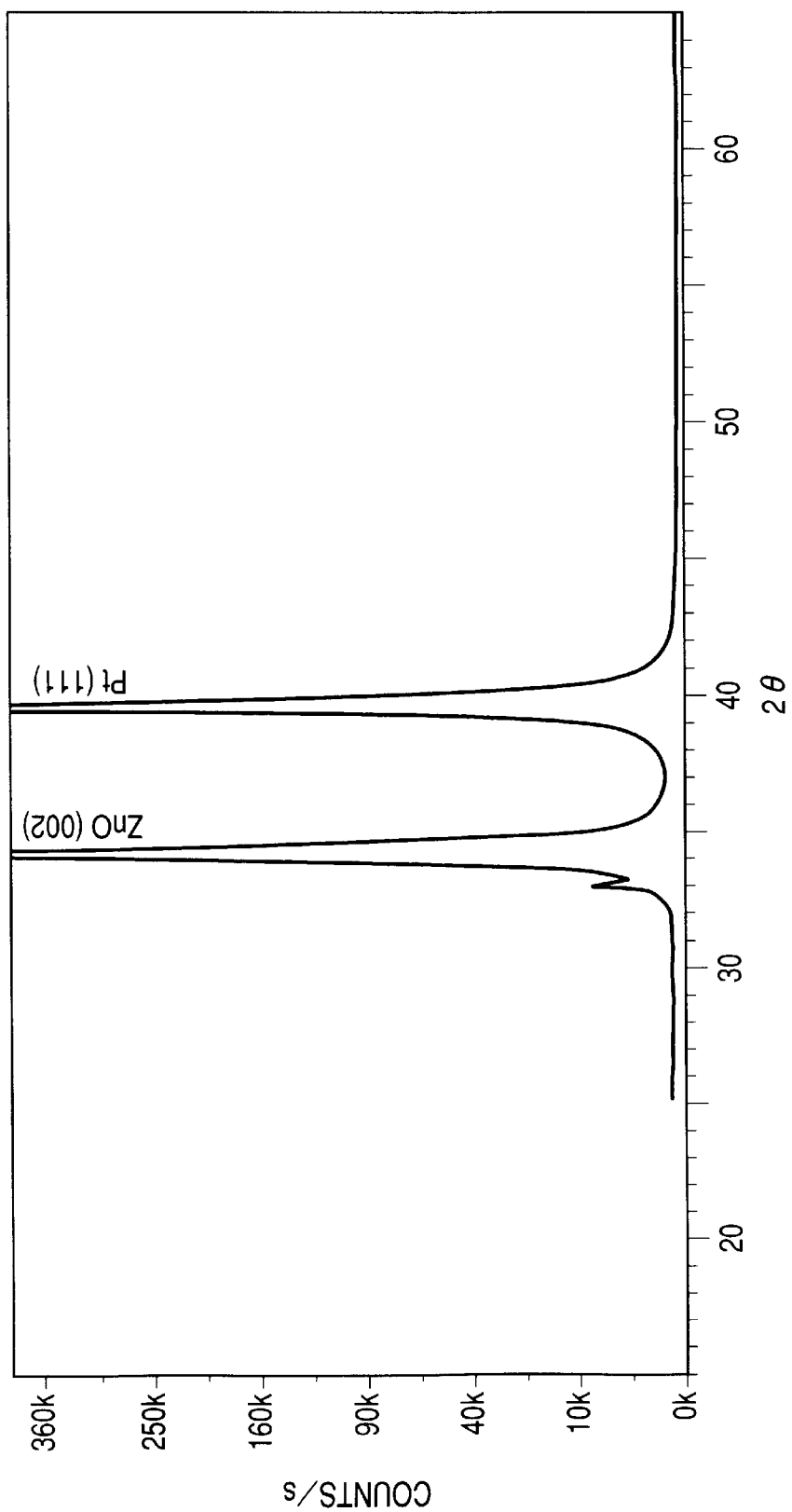
FIG. 14 is a graph showing the X-ray diffraction pattern of a ZnO layer as applied to the description of Example 2.
Figure 15:
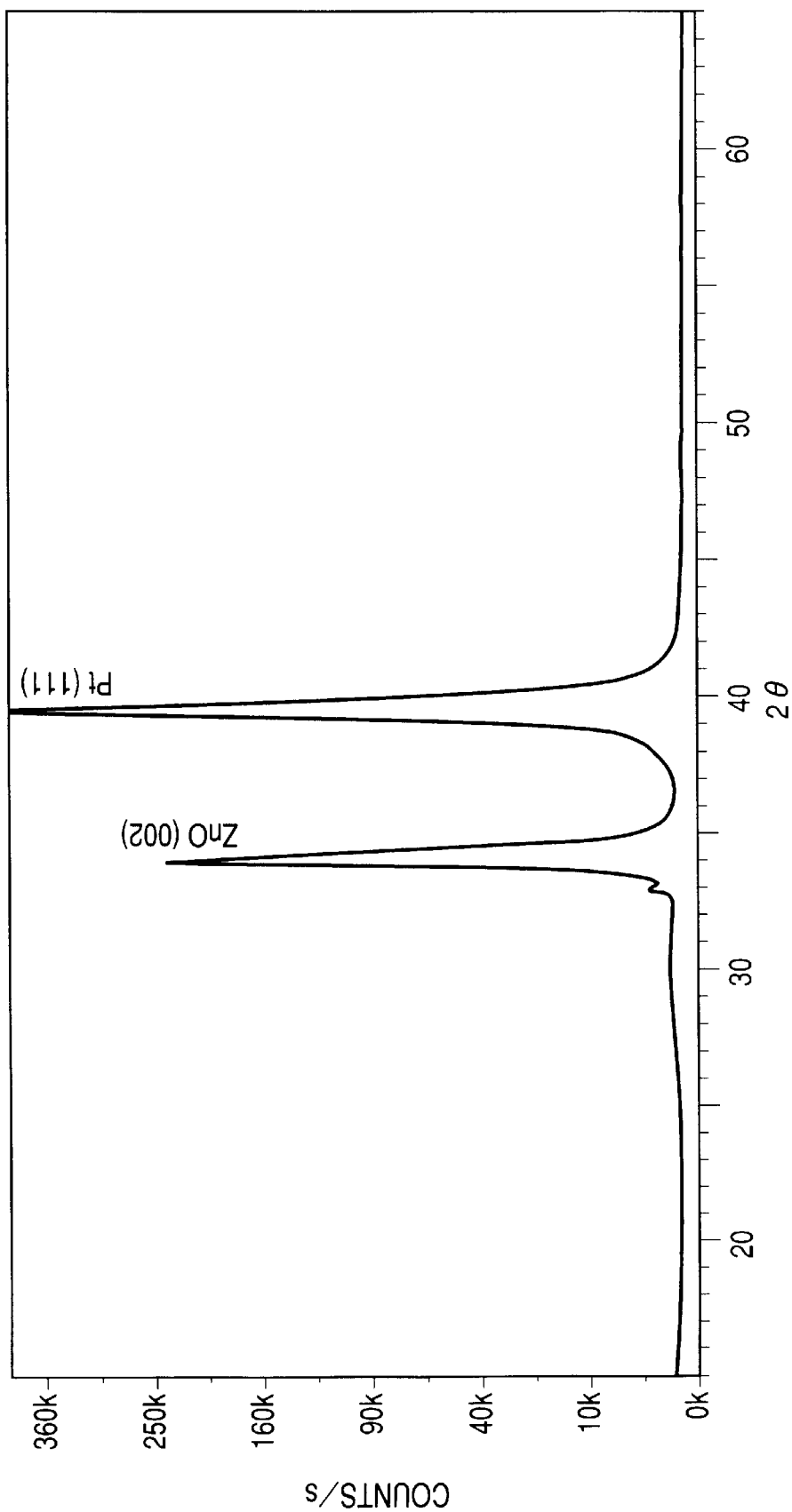
FIG. 15 is a graph showing the X-ray diffraction pattern of a lead zirconate titanate film before a heat treatment as applied to the description of Example 2.

A 20 nm thick tightly adhering layer of Ti and a 150 nm thick buffer layer of Pt that resists corrosion in a washing process for reuse and prevents diffusion of atoms were formed by RF sputtering on an SiO$_2$/Si substrate prepared by forming a thermal oxide film as Si diffusion prevention layer on an Si single-crystal substrate to produce a Pt(111)/Ti/SiO$_2$/Si substrate. Then, a ZnO layer was formed by RF sputtering to a thickness of 10 μm by using only Ar gas with indicated gas pressure of 2.0 Pa and at substrate temperature of 300° C. FIG. 14 is a graph showing the X-ray diffraction pattern of the ZnO/Pt(111)/Ti/SiO$_2$/Si substrate structure. As clearly seen from FIG. 14, the grains of the ZnO film were completely oriented in the direction of the C-axis. Thereafter, a Pt film is formed on the ZnO layer to produce a first electrode having an area smaller than the ZnO layer by RF sputtering. Then, an amorphous PZT film layer was formed thereon with an area same as the first electrode by using only Ar gas with indicated gas pressure of 3.0 Pa and with the substrate heater held in a turned off state. FIG. 15 is a graph showing the X-ray diffraction pattern of the PZT/Pt/Ti/ZnO/Pt/Ti/SiO$_2$/Si substrate in an as depo state. As seen from FIG. 15, the formed PZT film layer was not crystallized before a heat treatment process.

Figure 16:
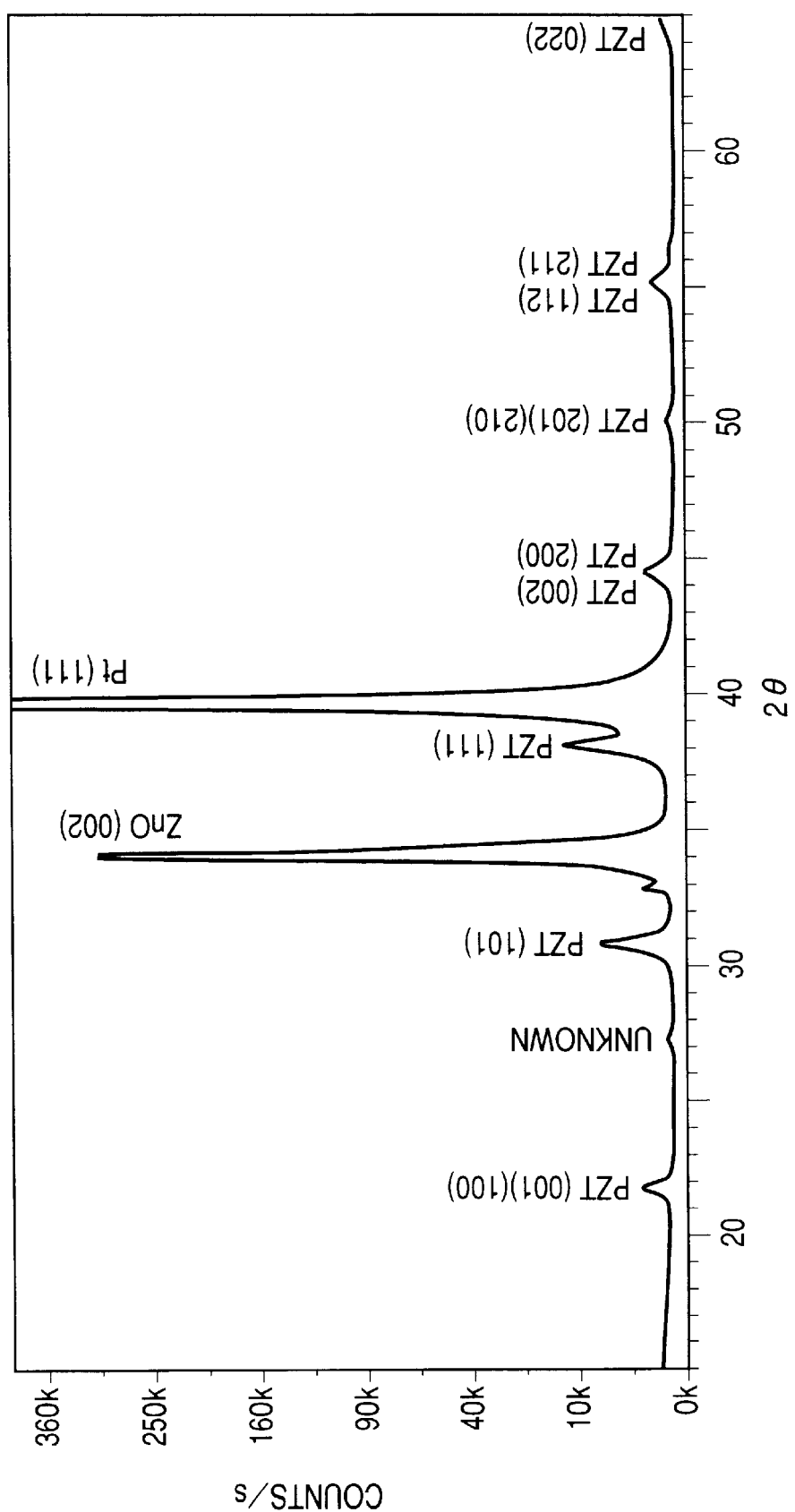
FIG. 16 is a graph showing the X-ray diffraction pattern of a lead zirconate titanate film after a heat treatment as applied to the description of Example 2.

The produced PZT film was crystallized in an oxygen atmosphere by raising the temperature at a rate of 1° C./min. and annealing it at 700° C. for 5 hours. FIG. 16 is a graph showing the X-ray diffraction pattern of the PZT/Pt/Ti/ZnO/Pt/Ti/SiO$_2$/Si substrate after the heat treatment. As seen from FIG. 16, the annealed PZT film layer was substantially a non-oriented single PZT layer. Then, a second electrode of Pt was formed by RF sputtering on the surface of the PZT film of the PZT/Pt/Ti/ZnO/Pt/Ti/SiO$_2$/Si substrate to produce a substrate structure of Pt/PZT/Pt/Ti/ZnO/Pt/Ti/SiO$_2$/Si.

Thereafter, a specimen of actuator was prepared for the purpose of evaluation by bonding a 30 μm thick Pyrex glass as vibrating plate onto an Si substrate provided with a groove as will be described hereinafter by means of anodic bonding and then the Pyrex glass was made as thin as 5 μm by polishing. Subsequently, the Si substrate to which the vibrating plate of Pyrex glass had been bonded was bonded to the side of the second electrode of the MgO substrate by means of an epoxy type adhesive agent.

Then, the substrates were heated to 150° C. to completely set the epoxy resin and then immersed in an acetic acid solution. The acetic acid solution was prepared by mixing glacial acetic acid and pure water at a ratio of 1:2. While the C-axis oriented ZnO film was etched at a very high rate of 450 nm/min in the acetic acid solution, the PZT film was hardly etched. Only the ZnO film was dissolved into the acetic acid solution and removed because ZnO is highly soluble to acetic acid solution when the solution was stirred by means of a stirrer and the etching process was conducted while applying ultrasonic oscillations in order to raise the efficiency of etching the ZnO film. Thus, the separated film was perfectly transferred. Note that the lift-off layer of ZnO had a surface area greater than the PZT film that was the film to be transferred.

While an acetic acid solution was used as etchant in this example, various solutions such as a dilute solution of strong acid such as sulfuric acid, nitric acid or hydrochloric acid at a concentration of less than 10 mol % and a mixture of such dilute solutions at different proportions may be used for the purpose of the invention. While the film to be transferred may be dissolved slightly into the solution, it may not raise any problem because the etching rate of the lift-off layer of ZnO is overwhelmingly high relative to that of the film to be transferred.

A uni-morph type actuator carrying a vibrating plate bonded to one of the surfaces of a piezoelectric element that was formed by arranging electrodes on the top and the bottom of a film showing a piezoelectric effect was prepared in this example. Various devices can be prepared by using such uni-morph type actuators and processing the Si substrates in various different ways. In this example, an ink-jet head comprising uni-morph type actuators was prepared by forming a groove on the Si substrate.

An operation of producing a pattern in alignment with the groove on the Si substrate was conducted on the Pt of the first electrode on the separated PZT film by dry etching. Then, the PZT film was subjected to a wet etching operation along the Pt pattern. FIG. 8 is a schematic cross sectional view of the uni-morph actuator prepared in this manner. The prepared uni-morph actuator showed a satisfactory displacement when a rectangular wave as shown in FIG. 9 was applied to it and observed by way of a laser Doppler displacement meter.

It was possible to repeatedly reuse the separated Pt/Ti/SiO$_2$/Si substrate to provide a great advantage from the cost point of view.

The prepared ink-jet head for ejecting ink was tested for ink ejection. The groove had been formed on the Si(100) substrate as ink flow path by anisotropic etching. FIG. 10 is a schematic cross sectional view of the ink-jet head prepared in this example as viewed from the side of the nozzle. As seen from FIG. 10, the grooves showed a profile of triangular prism. FIG. 11 is a schematic plan view of the ink-jet head. It comprises an ink supply chamber, a communication nozzle, a pressure chamber and an ejection nozzle. A passage is formed through part of the ink supply chamber. Isopropyl alcohol (IPA) was filled into the ink-jet head and the ink-jet head was driven to operate by applying a drive waveform as shown in FIG. 9 to see that droplets were ejected from the ejection nozzle.

What is claimed is:

1. A film transfer method for transferring a film from a first substrate onto a second substrate, said method comprising of:
   forming a lift-off layer on said fist substrate;
   forming a film to be transferred on said lift-off layer, said film to be transferred comprising a compound oxide material containing a plurality of metal elements;
   bonding said film to be transferred onto said second substrate; and
   etching said lift-off layer by means of an etchant and separating said second substrate from said first substrate.

2. A method according to claim 1, wherein said lift-off layer is made of ZnO.

3. A method according to claim 1, wherein said etchant is a weak acid.

4. A method according to claim 3, wherein said etchant is an acetic acid solution.

5. A method according to claim 1, wherein said etchant is a dilute solution containing only hydrochloric acid, nitric acid or sulfuric acid to a concentration level of not higher than 10 mol % or a mixture of any of them.

6. A method according to claim 1, wherein said film to be transferred is formed in such a way that the edges of said lift-off layer is not covered by said film to be transferred.

7. A method according to claim 1, wherein said lift-off layer is uniaxially oriented.

8. A method according to claim 1, wherein said lift-off layer is etched, while applying oscillations to it in said etchant.

9. A method according to claim 1, wherein said lift-off layer is etched, while said etchant is being heated.

10. A method according to claim 1, wherein said lift-off layer is etched, while said etchant is being stirred.

11. A method according to claim 1, wherein said lift-off layer is etched, while said first and second substrates are being moved.

12. A method according to claim 1, wherein said lift-off layer has a thickness not less than 10 microns.

13. A method according to claim 1, wherein said film to be transferred shows a piezoelectric effect.

14. A method according to claim 1, wherein said compound oxide has a perovskite structure and contains at least Pb.

15. A method according to claim 1, wherein a diffusion prevention layer is provided between said lift-off layer and said film to be transferred.

16. A method according to claim 15, wherein said diffusion prevention layer is made of nitride.

* * * * *